United States Patent
Garg et al.

(10) Patent No.: US 10,747,922 B1
(45) Date of Patent: Aug. 18, 2020

(54) TEST CIRCUITRY WITH ANNULARLY ARRANGED COMPRESSOR AND DECOMPRESSOR ELEMENTS

(71) Applicant: Cadence Design Systems, Inc., San Jose, CA (US)

(72) Inventors: Akhil Garg, Greater Noida (IN); Sahil Jain, Ghaziabad (IN); Vivek Chickermane, Slaterville Springs, NY (US)

(73) Assignee: Cadence Design Systems, Inc., San Jose, CA (US)

(*) Notice: Subject to any disclaimer, the term of this patent is extended or adjusted under 35 U.S.C. 154(b) by 107 days.

(21) Appl. No.: 15/956,573

(22) Filed: Apr. 18, 2018

(51) Int. Cl.
*G06F 30/33* (2020.01)
*G01R 31/28* (2006.01)
*G06F 30/333* (2020.01)

(52) U.S. Cl.
CPC ............. *G06F 30/33* (2020.01); *G01R 31/28* (2013.01); *G06F 30/333* (2020.01)

(58) Field of Classification Search
CPC ...... G06F 12/0207; G06F 12/04; G06F 13/16; G06F 13/28; G06F 9/3867; G06F 9/4494; G06F 12/0607; G06F 13/1673; G06F 13/1689; G06F 13/38; G06F 15/00; G06F 3/14; H04N 19/423; H04N 19/44; H04N 19/60; H04N 19/70; B41J 2/2139; B41J 2/04541; B41J 2/04573; B41J 2/155; G01R 31/3004; G01R 31/3181
USPC .................................................. 716/100–108
See application file for complete search history.

(56) References Cited

U.S. PATENT DOCUMENTS

| | | |
|---|---|---|
| 8,650,524 B1 * | 2/2014 | Chakravadhanula ....................... G06F 17/505 716/106 |
| 9,465,896 B1 | 10/2016 | Cunningham et al. |
| 9,470,756 B1 | 10/2016 | Wilcox et al. |
| 9,501,590 B1 | 11/2016 | Cunningham et al. |
| 9,513,335 B1 | 12/2016 | Wilcox et al. |
| 2015/0040087 A1 * | 2/2015 | Lin ................. G01R 31/318575 716/109 |

OTHER PUBLICATIONS

Chakravadhanula et al. "Advancing Test Compression to the Physical Dimension" 2017, IEEE pp. 1-10 (Year: 2017).*
Chakravadhanula, et al., "Advancing Test Compression to the Physical Dimension", IEEE International Test Conference, 2017.

* cited by examiner

*Primary Examiner* — Binh C Tat
(74) *Attorney, Agent, or Firm* — Foley & Lardner LLP

(57) ABSTRACT

A test circuit includes a plurality of codec logic elements arranged in a plurality of annular rings on an integrated circuit, each codec logic element configured to provide test bits to one or more respective scan chain and receive test result bits from the one or more respective scan chain. The test circuit further includes a decompressor logic arranged along at least one annular ring of the plurality of annular rings on the integrated circuit, the decompressor logic configured to provide test bits to at least one codec logic element in each annular ring. The test circuit also includes a compressor logic arranged transversely with respect to the plurality of annular rings on the integrated circuit, the compressor logic configured to receive test result bits from at least one of the plurality of codec logic elements.

13 Claims, 6 Drawing Sheets

TEST CIRCUITRY WITH ANNULARLY ARRANGED COMPRESSOR AND DECOMPRESSOR ELEMENTS

TECHNICAL FIELD

The present disclosure relates generally to integrated circuits, and more particularly to methods and apparatuses for testing integrated circuits.

BACKGROUND

Integrated circuits can include design for test (DFT) components for testing the integrated circuit. The DFT components accept test bits for input to the integrated circuit and to receive test result bits that are output by the integrated circuit. The test result bits are compared to expected result bits to determine if there are any errors in the operation of the integrated circuit.

SUMMARY

A test circuit includes a plurality of compressor-decompressor (codec) logic elements arranged in a plurality of annular rings on an integrated circuit, each codec logic element configured to provide test bits to one or more respective scan chains and to receive test result bits from the one or more respective scan chains. The test circuit further includes a decompressor logic arranged along at least one annular ring of the plurality of annular rings on the integrated circuit, the decompressor logic configured to provide test bits to at least one codec logic element in each annular ring. The test circuit also includes a compressor logic arranged transversely with respect to the plurality of annular rings on the integrated circuit, the compressor logic configured to receive test result bits from at least one of the plurality of codec logic elements.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

Figure 1:
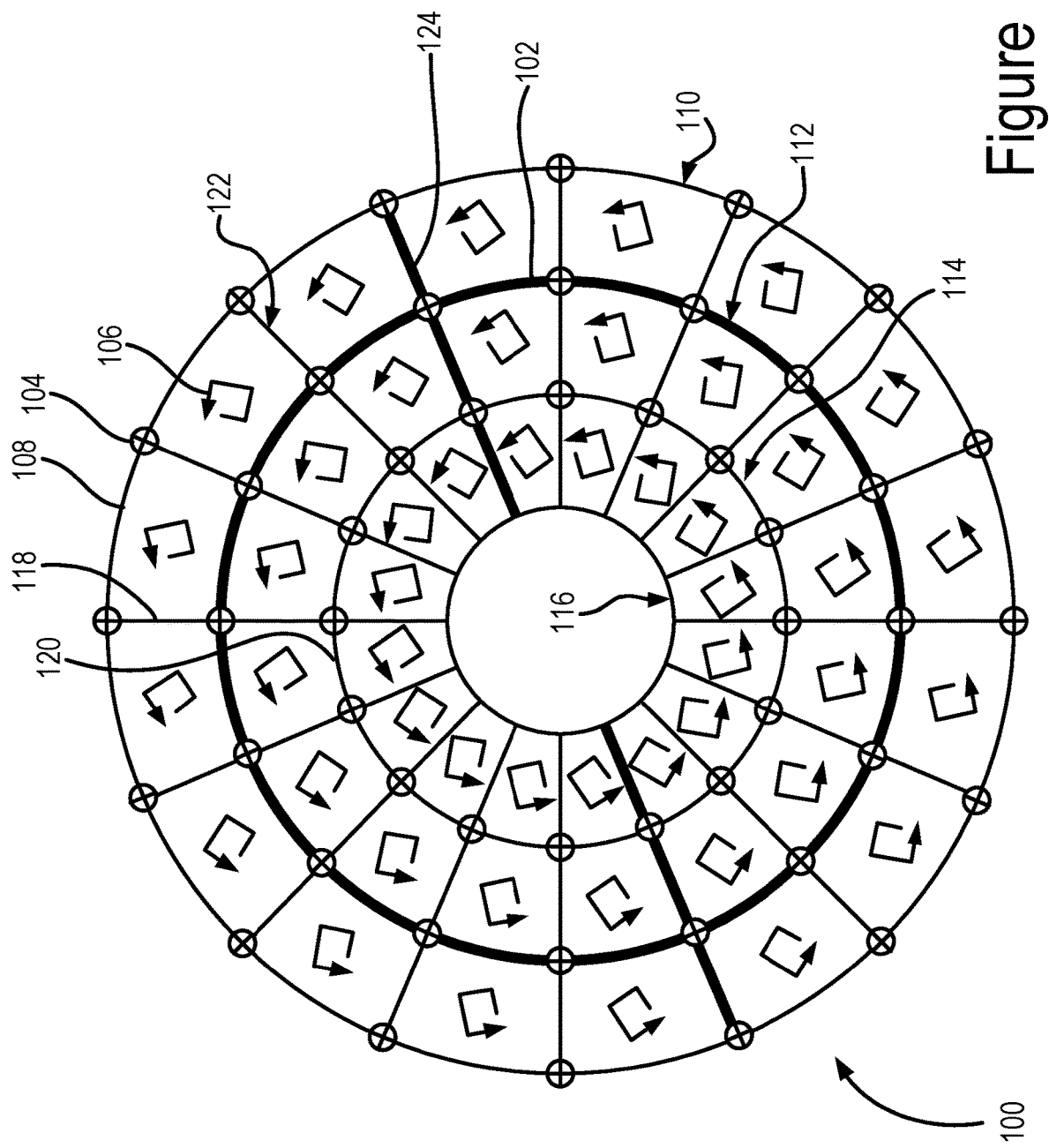
FIG. 1 shows an example DFT circuit according to the present embodiments.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

The most common method for delivering test data or test vectors from chip inputs to internal circuits under test ("CUT"), and observing their outputs, is called scan-design. Scan design is a form of structured DFT, which involves adding extra logic and signals dedicated for test according to some procedure. The circuit has two modes, normal mode and test mode. In test mode, registers (flip-flops or latches) in the design are connected in one or more scan chains, which are used to gain access to internal nodes of the chip. Each scan chain is essentially a single shift register with the flip-flops or latches making up the individual registers. In traditional designs, each scan chain is connected to the chip input/output test pins via routed scan-in scan-out wires. In designs with compression logic, a compressor and decompressor may be located between the chip input/output test pins and the scan chain routes. Test patterns are shifted in via the scan chain(s), functional clock signals are pulsed to test the circuit during "capture cycle(s)", and the results are then shifted out to chip output pins and compared against the expected "good machine" results. Each scan chain and/or its associated test pattern may be referred to as a channel. The decompressor is positioned between the input pins and the scan chains, while the compressor is positioned between the scan chains and the output pins. The decompressor receives an M bit input, which is decompressed into an N bit input. Thus, the decompressor has a compression ratio of N/M. Typically, the number of scan chains is equal to the N. At the output of the scan chains, the compressor compresses the resulting N bits into M bits, again with a compression ratio of N/M. That is, the compression logic compresses M bits in N bits. Higher compression ratio reduces the length of scan chains and the test time.

One drawback of the traditional DFT described above is that with an increase in the compression ratio, such as for example by increasing N, also increases the lengths of scan connections connecting the scan chains to the compressor and the decompressor, thereby increasing the congestion on the chip. In some instances, the increase in congestion may render one or more portions of the DFT circuit or the circuit under test unroutable. This may in turn constrain the compression ratio that the DFT circuit can achieve. That is, the compression ratio of the DFT circuit may have to be reduced to accommodate the scan connections. This can, in turn, reduce the efficiency of the DFT circuit.

The following discussion provides a DFT circuit that includes distributed compressor and decompressor logic, which reduces the lengths of scan connections needed between the compressor/decompressor and the scan chains. This improves the speed and the power consumption of the DFT circuit. In particular, the DFT circuit discussed below includes annular rings of codec logic elements forming an annular grid. Scan chains are positioned in regions within the annular grid. Circuits under test are generally fabricated in a manner such that the density of the components of the circuit under test is greater near a center of the chip area, than near the periphery of the chip area. By having an annular grid of codec logic elements further reduces the scan connection lengths that connect the compressor/decompressor logic to the scan chains. Reducing the length of the scan connections can free up chip real estate, that can be utilized to increase the compression ratio of the DFT circuit, thereby lowering the test time for testing the circuit under test.

FIG. 1 shows an example DFT circuit 100. The DFT circuit 100 can be fabricated on an integrated circuit including a circuit under test (not shown). The DFT circuit 100 includes a decompressor logic 102, a compressor logic 124, a number of codec logic elements 104, and a number of scan chains 106. It should be noted that the term "logic" used herein can represent circuits or circuit elements, that can include logic gates, transistors, resistors, capacitors, interconnects, switches, and other active or passive electrical elements. The codec logic elements 104 are arranged in a number of annular rings. For example, the codec logic elements 104 are arranged in a first annular ring 110, a second annular ring 112, and a third annular ring 114. Although the DFT circuit 100 includes three annular rings, it is understood that alternatively, the DFT circuit 100 may include less than, or more than, three annular rings. The DFT circuit 100 also includes annular scan connections 108 that couple each codec logic element 104 within an annular ring to at least one adjacent codec logic element 104 in the same annular ring. For example, in the first annular ring 110, annular scan connections 108 couple each codec logic element 104 to its two adjacent codec logic elements 104. The DFT circuit 100 also includes transverse scan connections 118 that couple each codec logic elements 104 in an annular ring to at least one other codec logic element in at least one adjacent annular ring. For example, each codec logic element 104 in the second annular ring 112 is coupled to a codec logic element 104 in the first annular ring 112 by a transverse scan connection 118. In one or more embodiments, one or more of the annular scan connections 108 can include wires or interconnects for connecting the respective codec logic elements 104. In one or more embodiments, one or more of the annular scan connections 108 can additionally include one or more buffers to maintain a desired signal strength and noise margin. In one or more embodiments, the transverse scan connections 118 can couple a codec logic element 104 to the decompressor logic 102. While the DFT circuit 100 includes equal number of codec logic elements 104 in each annular ring, it is understood that the number of codec logic elements in the annular rings may be unequal.

The DFT circuit 100 forms an annular grid, where annular scan connections 108 couple adjacent codec logic elements 104 located in the same annular ring, and transverse scan connections 118 couple codec logic elements 104 in adjacent annular rings. The annular scan connections 108 and the transverse scan connections 118 allow transfer of data between codec logic elements in the same annular ring between codec logic elements 104 across multiple annular rings. While FIG. 1 shows that annular rings in the DFT circuit 100 having a circular shape, it is understood that the annular rings can have other shapes, such as rectangular, square, elliptical, polygonal (regular or irregular), and the like.

The scan chains 106 are positioned within regions formed by the annular scan connections 108 and the transverse scan connections 118. In one or more embodiments, the number of scan chains 106 can be equal to the number of codec logic elements 104. As an example, each scan chain 106 can be coupled to a single codec logic element 104. As discussed further below, each scan chain 106 can receive scan data from its respective codec logic element 104 and provides test result data back to the respective codec logic element 104. The compressor logic 124 is positioned transversely to the annular rings of the DFT circuit 100. For example, the compressor logic 124 is positioned along a set of transverse scan connections 118 along a diameter or a diagonal of the annular grid of the DFT circuit 100. The decompressor logic 102 is positioned along one of the several annular rings. For example, the decompressor logic 102 is positioned along the second annular ring 112 of codec logic elements 104. In one or more embodiments, the decompressor logic 102 is positioned along an annular ring that is the middle-most annular ring. In the DFT circuit 100 shown in FIG. 1, there are an odd number of annular rings. Therefore, the decompressor logic 102 can be positioned on the second annular ring 112. In instances where the DFT circuit 100 includes an even number of annular rings, there is no single middle-most annular ring. Instead, the DFT circuit 100 will have two middle-most annular rings. In such instances, the decompressor logic 102 can be positioned along any one of the two middle-most annular rings.

Figure 2:
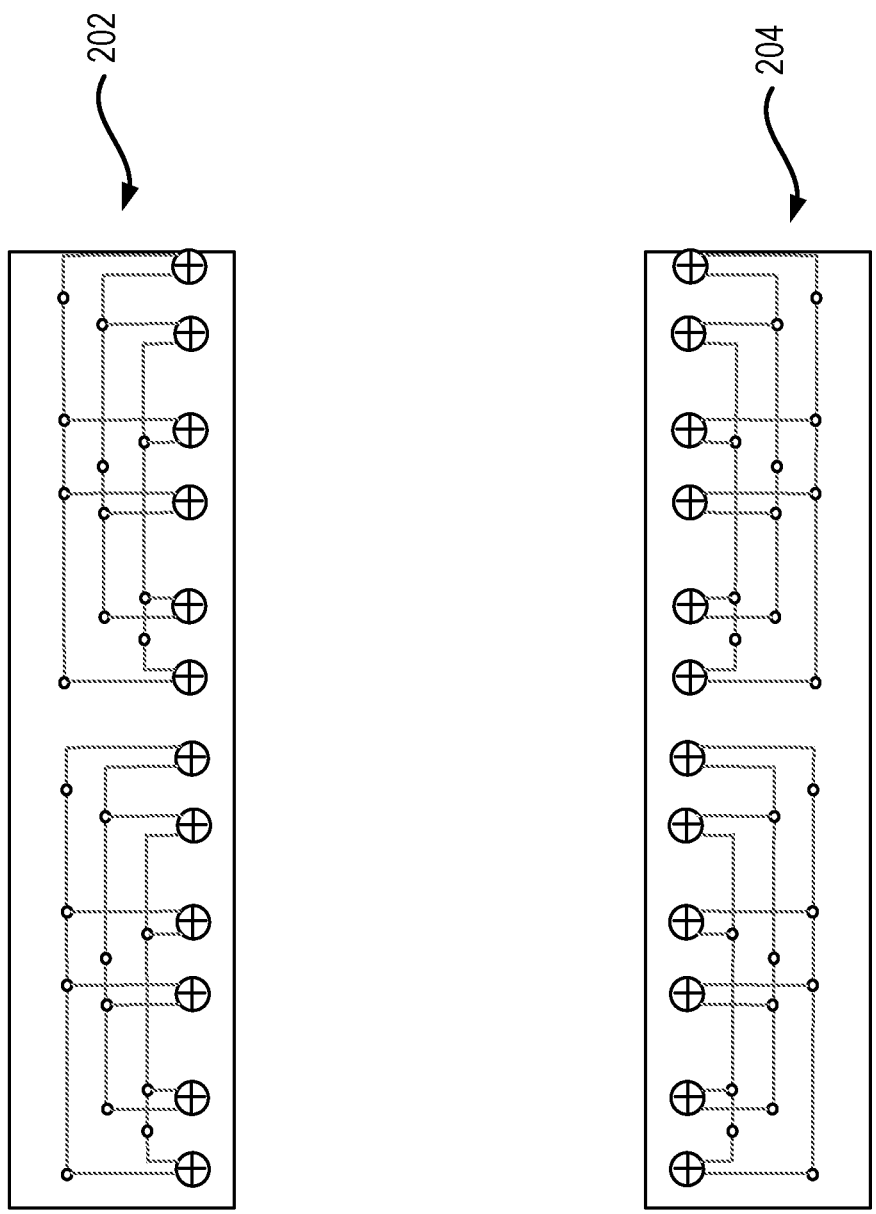
FIG. 2 illustrates block diagrams of an example decompressor logic and an example compressor logic, according to the present embodiments.

The decompressor logic 102 can include circuitry that converts test data from an N pin scan in input into L bits of decompressed test data. In one or more embodiments, the decompressor logic 102 can include combinatorial circuitry. The combinatorial circuitry can include a spreader type circuitry that includes XOR gates or can include broadcast type circuitry in which a single scan in input is connected to multiple outputs. Alternatively, the decompressor logic 102 can include sequential linear feedback register based circuitry. FIG. 2 illustrates block diagrams of an example decompressor logic 202 and an example compressor logic 204. The example decompressor logic 202 and the example compressor logic 204 can be used to implement the decompressor logic 102 and the compressor logic 124, respectively, of the DFT circuit 100 shown in FIG. 1. The example decompressor logic 202 can include a spreader type circuitry, which includes XOR gates that can convert test data received over an N pin scan in input in to a L bits of decompressed test data. The example decompressor logic 202 can include, for example, an implementation of an N to L acyclic directed graph. Similarly, the example compressor logic 204 can include, for example, an implementation of an L to N acyclic directed graph. In one or more embodiments, the compression ratio of the decompressor logic can be different from the compression ratio of the compressor logic.

While not shown in FIG. 1, the DFT circuit 100 can additionally include one or more I/O terminals or logic that provide compressed test bits or test vectors to the decompressor logic 102 from a source outside of the integrated circuit package. The I/O terminals or logic can also output test result bits received from the compressor logic 124 to test equipment located outside of the integrated circuit package.

Figure 3:
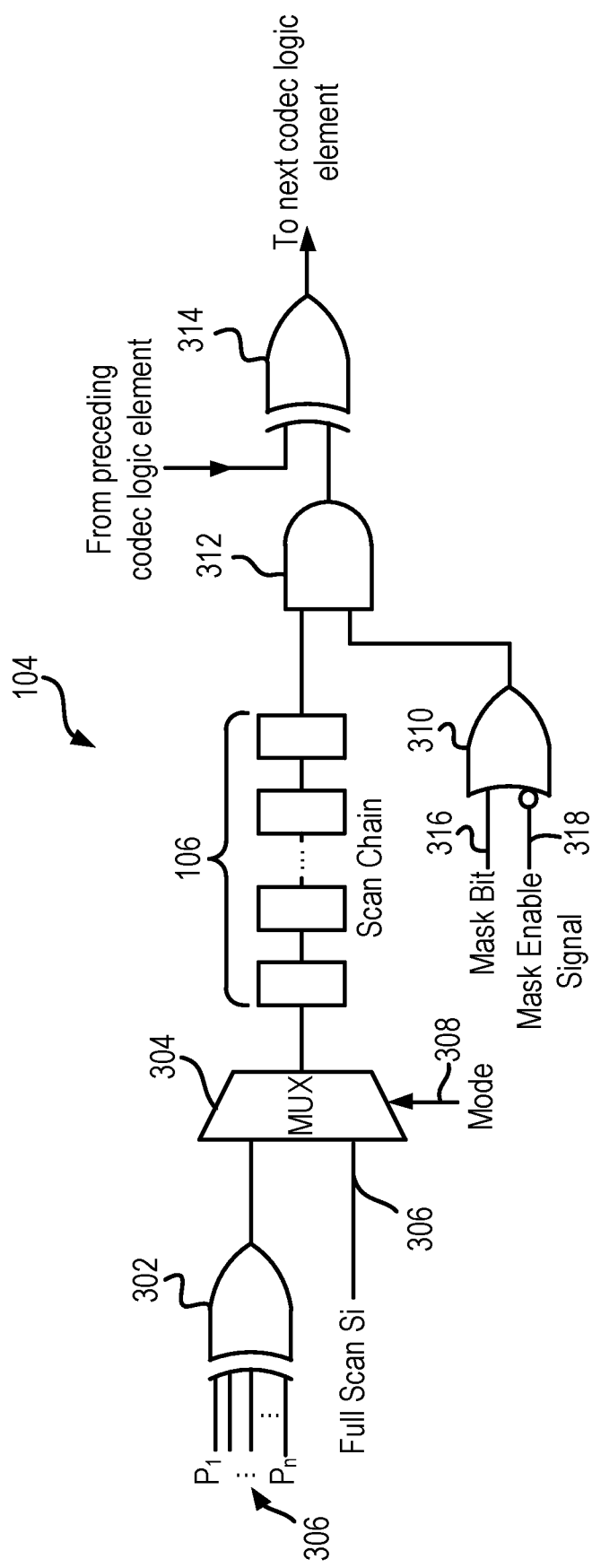
FIG. 3 illustrates an example implementation of the codec logic element shown in FIG. 1, according to the present embodiments.

The DFT circuit 100 can have a distributed compressor-decompressor architecture. In particular, the DFT circuit 100 can include compressor-decompressor logic in each of the codec logic elements 104. FIG. 3 illustrates an example implementation of the codec logic element 104 shown in FIG. 1. The codec logic element 104 can include an decompressor XOR gate 302, a multiplexer (MUX) 304, an AND gate 312, a compressor XOR gate 314, and a OR gate 310. The decompressor XOR gate 302 receives P inputs from the decompressor logic 102 sown in FIG. 1. The output of the decompressor XOR gate 302 can be provided to one input of the MUX 304. A Full Scan Si input 306 is coupled to a second input of the MUX 304. The Full Scan Si input 306 allows providing test bits to the scan chain 106 without undergoing decompression. The Mode input 308 can control the operation of the MUX 304 by selectively allowing either the output of the decompressor XOR gate 302 or the Full Scan Si input 306 at the output of the MUX 304. The output of the MUX 304 is coupled to the input of the scan chain 106. The scan chain can include a number of registers connected in series that can store the values of the test bits as well as the values of the test result bits. The output of the scan chain 106 is provided to one input of the AND gate 312, the other input of which is coupled to the output of the OR gate 310. One input of the OR gate 310 receives a mask bit input 316, while the other input receives a mask enable signal 318. The mask bit can be provided to prevent Xs (e.g., unknown or undefined bits or signal levels) in the scan chain 106 from propagating to the compressor logic 124 and to the testing equipment. In one or more embodiments, including masking bits can improve the compression ratio. To allow the mask bit to operate on the output of the scan chain 106, the mask enable signal 318 is switched to a logical '1' value, which allows the logical value of the mask bit 316 to appear at the output of the OR gate 310. The AND gate 312 ANDs the output of the scan chain 106 and the output of the OR gate 310 and outputs the result to an input of the compressor XOR gate 314. Another input of the compressor XOR gate 314 is coupled to an output of a compressor XOR gate in a preceding codec logic element 104. The output of the compressor XOR gate 314 is provided to a subsequent codec logic element 104. In one or more embodiments, the codec logic element 104 may not include the MUX 304, the OR gate 310 and the AND gate 312.

Figure 4:
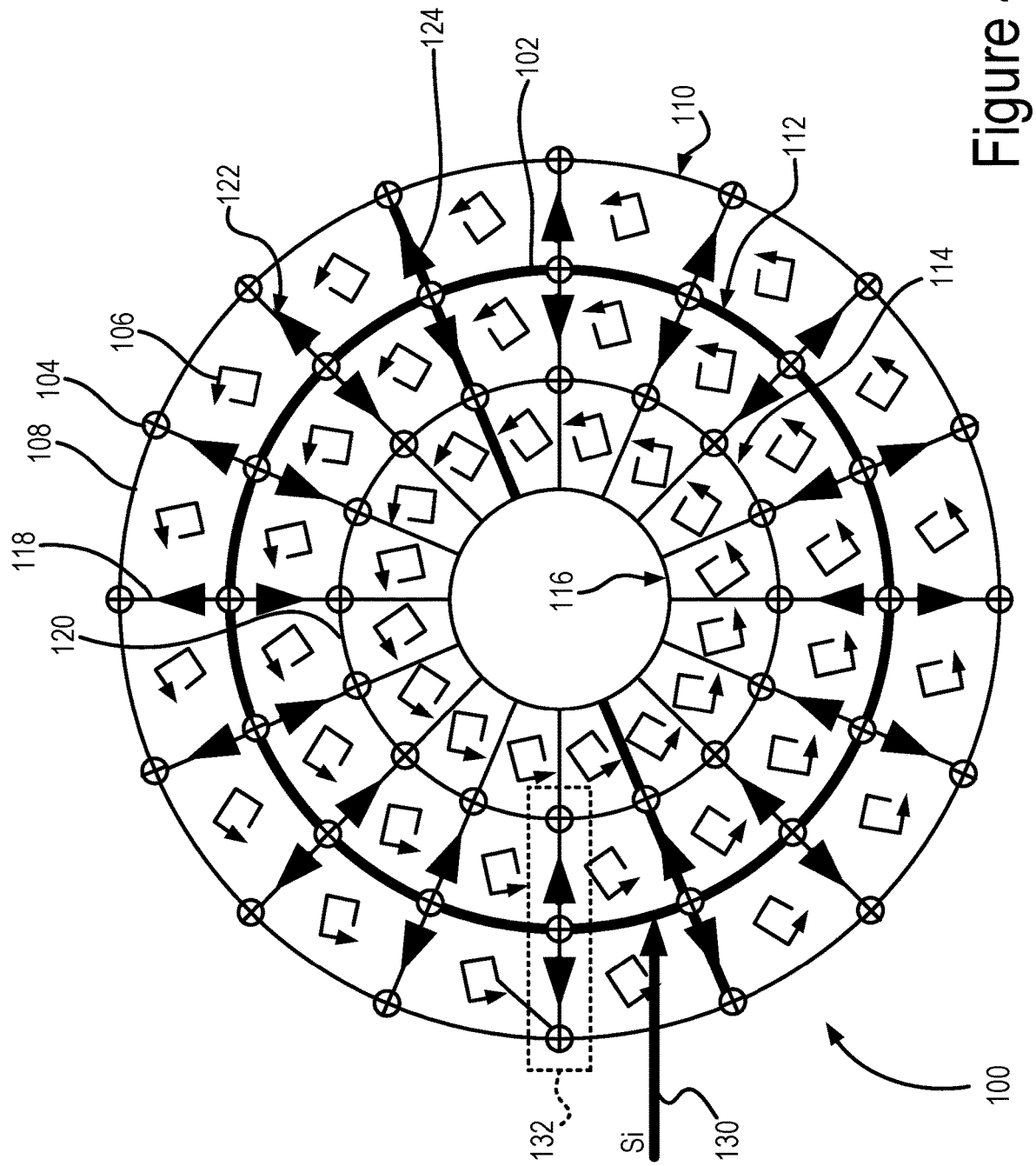
FIG. 4 illustrates a test bit pattern loading operation of the DFT circuit shown in FIG. 1, according to the present embodiments.

FIG. 4 illustrates a test bit pattern loading operation of the DFT circuit 100 shown in FIG. 1. As mentioned above, the DFT circuit 100 receives test bits from test equipment located outside of the chip via scan in pins on the integrated circuit on which the DFT circuit 100 is fabricated. The scan in pins can be pins that are dedicated for receiving test bits. Alternatively, the scan in pins can be multiplexed to be used as scan in pins during testing operation and used as signal pins for the CUT during non-testing operation of the CUT. FIG. 4 shows a scan in input Si providing compressed test bits to the decompressor logic 102. As discussed above, the decompressor logic 102 converts N bit compressed test input into L bit decompressed test bits. The L test bits generated by the decompressed logic are provided to the codec logic elements 104. Specifically, the L test bits are divided into R groups of P bits, where R denotes the number of codec logic elements 104 in an annular ring. For example, the DFT circuit 100 shown in FIGS. 1 and 4 includes 16 codec logic elements in each annular ring. Therefore, the L bits generated by the decompressor logic 102 can be divided into 16 groups of P bits. The value of P can be determined by dividing L by the number of groups R. For example, if the decompressor logic 102 generates 64 decompressed test bits (i.e., L=64), and the number of groups R is equal to 16, then the number of bits P is equal to 4. In instances where the L is not divisible by R, at least one of the R groups can include an unequal number of bits. For example, if L is equal to 65 and R is equal to 16, then 15 of the 16 groups can have 4 bits, while one group can have 5 bits.

Codec logic elements 104 in each annular ring that are similarly positioned in the transverse direction can be grouped in a single transverse group. For example, FIG. 4 identifies a first transverse group 132 including codec logic elements 104 in the first, second, and the third annular rings 110, 112, and 114 that are positioned in the same transverse direction. The DFT circuit 100 can include R such transverse groups. Each codec logic element 104 in the first transverse group 132 receives the same P bits as input, which is provided as input to the decompressor XOR gate (302, FIG. 3). The P bits can be provided to each codec logic element 104 within the first transverse group 132 via the transverse scan connections 118. For example, the transverse scan connections 118 of each codec logic element 104 in the first transverse group 132 can be connected in parallel to P out of L interconnects of the decompressor logic 102. In a similar manner, codec logic elements 104 in other transverse groups are provided with their respective P bits, such that two different transverse groups of codec logic elements 104 receive different P bits from the L decompressed test bits. While not shown in FIGS. 1 and 3, the DFT circuit 100 also can include interconnects that provide signals such as the full scan Si 306, the mode selection signal 308 the mask bit 316, and the mask enable signal 318 to each codec logic element 104.

Figure 5:
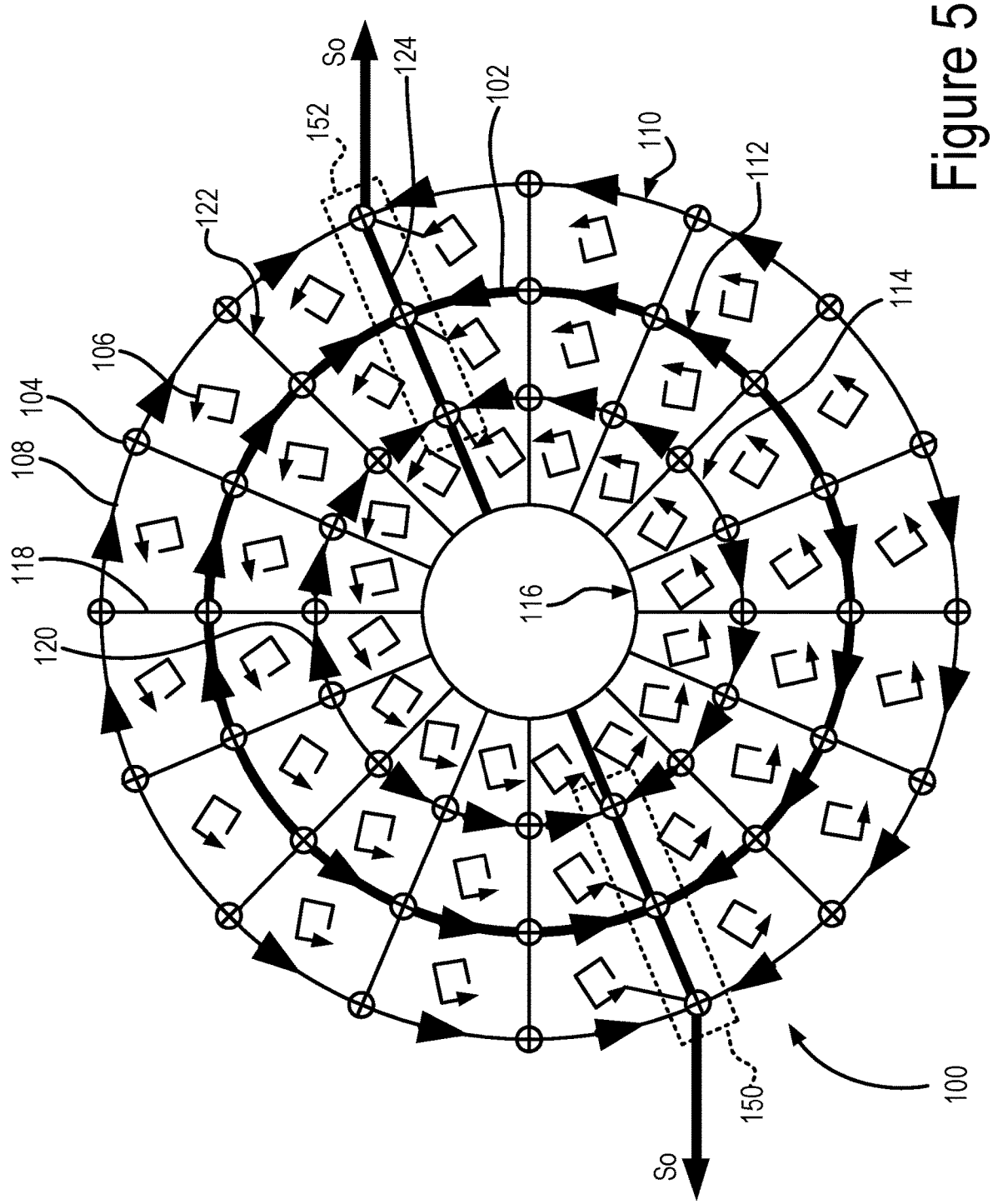
FIG. 5 illustrates a test result bit pattern output operation of the DFT circuit shown in FIG. 1, according to the present embodiments.

During loading of the test pattern into the DFT circuit 100, the scan in pins Si provide N compressed test bits to the decompressor logic 102. The decompressor logic 102 decompresses the N compressed test bits into L decompressed test bits. The L decompressed test bits are divided into R groups of P bits each. Each of the R groups of P bits is provided to a different transverse group of codec logic elements 104, such that the codec logic elements 104 in the same transverse group receive the same P bits. As the decompressor XOR gate (302, FIG. 3) of each codec logic element 104 is coupled to the input of the respective scan chain 106, the test bits for each scan chain 106 is available to be input into the CUT for testing. This ends the loading stage of the test operation of the DFT circuit 100. Following the loading of the test pattern into the DFT circuit 100, clock signals to the scan chains 106 can be actuated to initiate the inputting of the test bits into the CUT. The scan chains 106 also receive the result bits from the CUT. An output operation of the DFT circuit 100 includes outputting the result bits to the test equipment by first compressing the result bits, and then outputting the compressed result bits via the scan out pins of the integrated circuit. FIG. 4 shows FIG. 5 illustrates a test result bit pattern output operation of the DFT circuit 100 shown in FIG. 1. The test result bits from each scan chain 106 are provided to the compressor XOR gate (314, FIG. 3) of the respective codec logic element 104. The codec logic elements 104 in each annular ring are connected such that the test result bit output of each codec logic element 104 in a annular ring is provided to the adjacent codec logic element 104 in the same annular ring in the direction of the compressor logic 124. Each codec logic element 104 XORs the test result bit received from the preceding codec logic element 104 in the same annular ring with the result test bit generated by its respective scan chain.

The resulting signal is transmitted over the annular scan connection 108 to the next codec logic element 104 in the direction of the compressor logic 124. The direction of the flow of the signals in each annular ring is shown with arrows in FIG. 5. The codec logic elements 104 positioned along the compressor logic 124 have an additional input to their respective compressor XOR gate 314. In particular, a second group 150 of codec logic elements 104 and a third group 152 of codec logic elements 104 that are positioned along the compressor logic 124 receive test result bits from two directions. Therefore, their respective compressor XOR gates 314 include three inputs, two receiving test result bits from two adjacent codec logic elements in the same annular ring, and one receiving test result bits from its respective scan chain 106.

The compressor logic 124 can receive outputs from six codec logic elements 104 in the second and third groups 150 and 152 of codec logic elements. The compressor logic 124 can convert the 6 bit input into a compressed result bits. In one or more embodiments, the number of compressed result bits can be less than the total number of test result bits received by the compressor logic 124 from the second and third groups 150 and 152 of codec logic elements. As an example, the compressor logic 124 can be implemented using the compressor logic 204 discussed above in relation to FIG. 2.

In one or more embodiments, the positions of the compressor logic 124 and the decompressor logic 102 can be interchanged. That is, the compressor logic 124 can be positioned along an annular ring, and the decompressor logic 102 is positioned transversely with respect to the annular rings. In some such embodiments, the decompressor logic 102 can divide the L decompressed test bits into R groups, where R would be equal to the number of annular rings. Further, each codec logic element 104 in the same annular ring would receive the same P bits. With regard to the result bits, the codec logic elements 104 can be configured to pass on the result test bit to the correspondingly positioned codec logic element 104 in the adjacent annular ring in the direction of the compressor logic 124. Thus, the compressor logic 124 would receive 16 result bits, which it can convert into a smaller number of compressed result bits.

Figure 6:
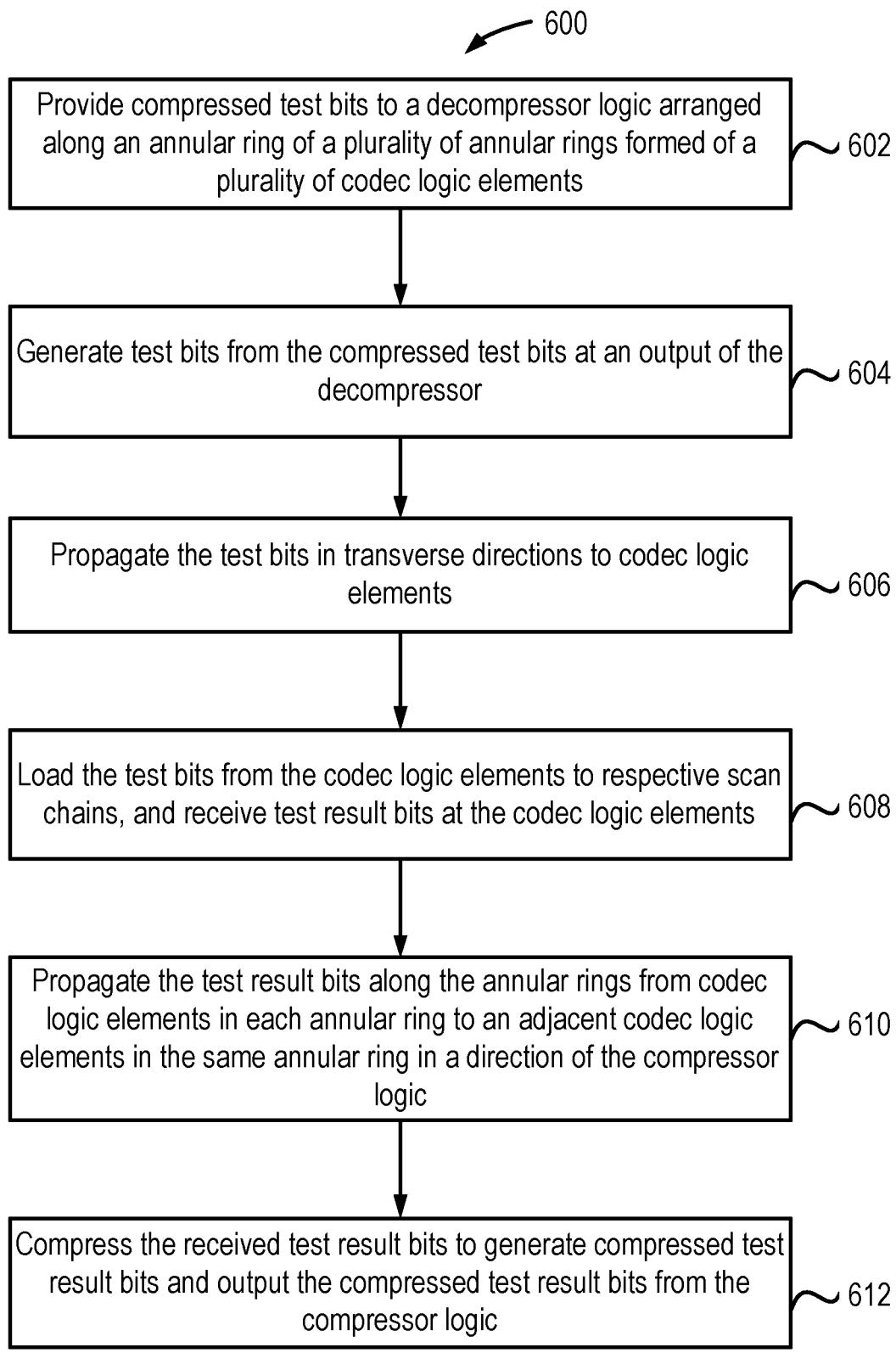
FIG. 6 shows a flow diagram of an example process for testing a circuit, according to the present embodiments.

FIG. 6 shows a flow diagram of an example process 600 for testing a circuit. In particular, the process 600 can be executed by a controller controlling the DFT circuit 100 discussed above in relation to FIG. 1. The process 600 includes providing compressed test bits to a decompressor logic arranged along an annular ring of a plurality of annular rings formed of a plurality of codec logic elements (602). As shown in FIG. 1, the decompressor logic 102 is positioned along the second annular ring 112 of the first, second, and third annular rings 110, 112, and 114 formed of a plurality of codec logic elements 104. The controller can control the decompressor logic 102 to receive the compressed test bits from a test pattern generator, which can be located on the integrated circuit or outside of the integrated circuit via scan in input Si (130, FIG. 4).

The process 600 further includes generating test bits from the compressed test bits at an output of the decompressor logic (604). As discussed above, the controller can control the decompressor logic 102 to decompress N compressed test bits into L test bits. The decompressor logic 102 can divide the L test bits into R groups of P test bits, where R is equal to the number of transverse groups of codec logic elements in the DFT circuit 100, as discussed above in relation to FIG. 4.

The process 600 also includes propagating the test bits in transverse directions to the codec logic elements (606). As discussed above in relation to FIG. 4, the decompressor logic 102 is arranged such that P bits are provided to each of the R transverse groups of codec logic elements. Further, codec logic elements in the same transverse group receive the same P bits. Furthermore, two different transverse groups of codec logic elements receive different P bits of the L decompressed test bits.

The process 600 also includes loading the test bits from the codec logic elements to respective scan chains, and receiving test result bits from outputs of the scan chains at the codec logic elements (608). At least one example of this process stage is discussed above in relation to FIG. 3. For example, as shown in FIG. 3, the output of the decompressor XOR gate 302 is provided to the input of the scan chain 106.

The process 600 further includes propagating the test result bits along the annular rings from codec logic elements in each annular ring to an adjacent codec logic elements in the same annular ring in a direction of a compressor logic (610). At least one example of this process stage is discussed above in relation to FIG. 5. For example, codec logic elements 104 in each annular ring provide their test result bits to the subsequent codec logic element in the respective annular ring in the direction of the compressor logic 124. The compressor XOR gate 314 in each codec logic element 104 XORs the test result bit received from the preceding codec logic element with the test result bit of its own scan chain 106 and provides the result to the subsequent codec logic element 104 in the same annular ring in the direction of the compressor logic 124. The controller can control the codec logic elements to propagate the test result bits annularly from one codec logic element to another codec logic element until the test result bits reach the compressor logic 124.

The process 600 further includes compressing the received test result bits to generate compressed test result bits, and outputting the compressed test result bits from the compressor logic (612). The controller can control the compressor logic 124 to compress the test result bits and output the compressed test result bits to test equipment, in a manner discussed above in relation to FIGS. 2 and 5.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A test circuit for testing an integrated circuit, comprising:
   a plurality of compressor-decompressor (codec) logic elements arranged in a plurality of annular rings on an integrated circuit, each codec logic element configured to provide test bits to one or more respective scan chains and to receive test result bits from the one or more respective scan chains;
   a decompressor logic arranged along at least one annular ring of the plurality of annular rings on the integrated circuit, the decompressor logic configured to provide test bits to at least one codec logic element in each annular ring;
   a compressor logic arranged transversely with respect to the plurality of annular rings on the integrated circuit, the compressor logic configured to receive test result bits from at least one of the plurality of codec logic elements, wherein the test result bits represent test results of a circuit under test in the integrated circuit;

annular scan connections coupling codec logic elements in each annular ring to at least one adjacent codec logic element in the same annular ring; and transverse scan connections coupling codec logic elements in each annular ring to at least one codec logic element in at least one adjacent annular ring.

2. The test circuit of claim 1, wherein the plurality of annular rings of codec logic elements, the annular scan connections, and the transverse scan connections form an annular grid structure having a plurality of sectors, wherein each sector of the plurality of sectors includes the one or more respective scan chains.

3. The test circuit of claim 1, wherein a first group of transversely arranged codec logic elements from the plurality of codec logic elements receive a same first set of test bits from the decompressor logic.

4. The test circuit of claim 3, wherein a second group of transversely arranged codec logic elements from the plurality of codec logic elements receive a same second set of test bits, distinct from the first set of test bits, from the decompressor logic.

5. The test circuit of claim 3, wherein each codec logic element of the plurality of codec logic elements is configured to receive test bits from the decompressor logic over the transverse scan connections.

6. The test circuit of claim 3, wherein each codec logic element of the plurality of codec logic is configured to receive test result bits from at least one respective scan chain, and to pass the test result bits to a subsequent codec logic in the respective annular ring in a direction of the compressor logic.

7. The test circuit of claim 6, wherein the total number of test result bits received by the compressor logic is equal to twice a total number of the plurality of annular rings.

8. The test circuit of claim 1, wherein the at least one annular ring of the plurality of annular rings along which the decompressor logic is arranged includes a middle-most annular ring of the plurality of annular rings.

9. The test circuit of claim 1, wherein a shape of the plurality of annular rings includes one of a circle, a rectangle, an oval, or a polygon.

10. The test circuit of claim 1, wherein each annular ring includes a same number of codec logic elements.

11. The test circuit of claim 1, wherein a total number of the plurality of codec logic elements is equal to a total number of scan chains.

12. The test circuit of claim 1, wherein at least one codec logic element of the plurality of codec logic elements includes a decompressor XOR gate configured to receive a subset of test bits generated by the decompressor logic and provide an output to the respective scan chain, and a compressor XOR gate configured to receive test result bits from the one or more respective scan chains, receive an output from a first adjacent codec logic element, and provide an output to one of a second adjacent codec logic element or the compressor logic.

13. The test circuit of claim 1, wherein at least one codec logic element of the plurality of codec logic elements includes a mask bit input, wherein the at least one codec logic element logically ANDS the mask bit with the test result bits prior to providing the test result bits to the compressor logic.

* * * * *